United States Patent [19]
Marks et al.

[11] 4,447,857
[45] May 8, 1984

[54] SUBSTRATE WITH MULTIPLE TYPE CONNECTIONS

[75] Inventors: Robert Marks, South Burlington; Douglas W. Phelps, Jr.; William C. Ward, both of Burlington, all of Vt.

[73] Assignee: International Business Machines Corporation, Armonk, N.Y.

[21] Appl. No.: 328,889

[22] Filed: Dec. 9, 1981

[51] Int. Cl.³ .......................... H05K 1/09; H05K 1/18
[52] U.S. Cl. ................................. 361/395; 174/52 H; 361/403; 361/411
[58] Field of Search .......................... 174/68.5, 52 H; 361/403, 395, 400, 411

[56] References Cited

U.S. PATENT DOCUMENTS

| | | | |
|---|---|---|---|
| 3,544,704 | 12/1970 | Glenn et al. | 174/68.5 |
| 3,591,839 | 7/1971 | Evans | 174/68.5 X |
| 3,770,874 | 11/1973 | Kreiger et al. | 174/68.5 |
| 3,778,530 | 12/1973 | Reimann | 174/68.5 |
| 3,781,596 | 12/1973 | Galli et al. | 174/68.5 X |
| 3,809,797 | 5/1974 | McMunn et al. | 174/68.5 X |
| 4,074,342 | 2/1978 | Honn et al. | 361/411 |
| 4,145,120 | 3/1979 | Kuboto | 361/411 X |

OTHER PUBLICATIONS

Gedney et al., Low-Cost Integrated Circuit, IBM Tech. Disc. Bull., vol. 20, #9, Feb. 1978, pp. 3399 & 3400.
F. W. Eurglunes, Via Hole Filling Technique, IBM Tech. Disc. Bull., vol. 12, #4, Sep. 1969, p. 596.

*Primary Examiner*—R. R. Kucia
*Attorney, Agent, or Firm*—George Tacticos; Theodore E. Galanthay; William N. Hogg

[57] ABSTRACT

A novel substrate is disclosed which can mount either flip-chip solder bonded IC chips or wire bonded chips, or both chips, or a single chip having both solder bonds and wire bonds is disclosed. The substrate has an array of solder pads which will accept solder bonds. Those pads which are to be used for wire bonding have mounted thereon a trimetallic pedestal. Each pedestal has a layer of solder metal bonded to the solder pad, a top layer metal suitable for wire bonding, such as, aluminum or gold, and an intermediate layer of metal, such as nickel, which is impervious to both solder metal and the top layer metal.

4 Claims, 4 Drawing Figures

SUBSTRATE WITH MULTIPLE TYPE CONNECTIONS

BACKGROUND OF THE INVENTION

In packaging semiconductor chips, the principal technique is to mount the chips on ceramic or plastic substrates which are used to mount the chips and to provide the necessary pin input/output (I/O) connections. The substrates also may contain some circuit components such as capacitors and resistors. Many times it is desirable to package more than one kind of chip on a given substrate, or to make differnt types of connections to a single chip. Thus mounting pads for each of the chips must be provided as well as the necessary interconnect lines.

There are two principal systems for connecting chips to substrates. One system is the so called flip-chip solder bonding system, wherein solder connections on the face of the chip are soldered to solder pads formed on the substrate. This provides both mechanical bonding and electrical connections between the chip and substrate. The other system is a wire bonding system wherein wires, typically formed of aluminum or gold are connected such as by ultrasonic welding to aluminum, or gold, or other compatible metal on the chips and on the substrate. The chip may also be adhesively bonded to improve mechanical strength. Unfortunately, however, neither aluminium nor gold and solder are compatible, and they cannot be connected to each other, i.e., neither gold wire nor aluminum wire can be bonded to conventional Pb/Sn solder satisfactorily. Thus, it has not been possible to mix the two systems of connections on a single substrate, i.e., the multiple chip substrates have had to be all flip-chip solder bonded or all wire bonded, and any given chip would have only one type of connection.

SUMMARY OF THE INVENTION

According to the present invention, a technique is provided where both solder bonding and wire bonding can be performed on the same substrate. To accomplish this an array of solder pads is provided on a substrate. Those pads where wire bonding is to take place each have soldered to them a multi-layered metal pad. Each metal pad has a solder layer soldered to its corresponding pad, an upper layer of metal which will bond to the wire of wire bond chips, and a barrier layer metal interposed between said first two mentioned layers which will bond to each of the said first two mentioned layers, but which is impervious to the solder metal and metal of the top layer. This will convert otherwise wire incompatible solder pads to pads which can be wire bonded. This technique allows any given chip to have both flip chip solder bonds and wire bonds if desired and also any given substrate to have chips of both kinds mounted thereon.

DESCRIPTION OF THE DRAWINGS

FIG. 3 is a perspective view of a pedestal according to this invention for attachment to the selected pads on the ceramic substrate.

DESCRIPTION OF THE PREFERRED EMBODIMENTS

Figure 1:
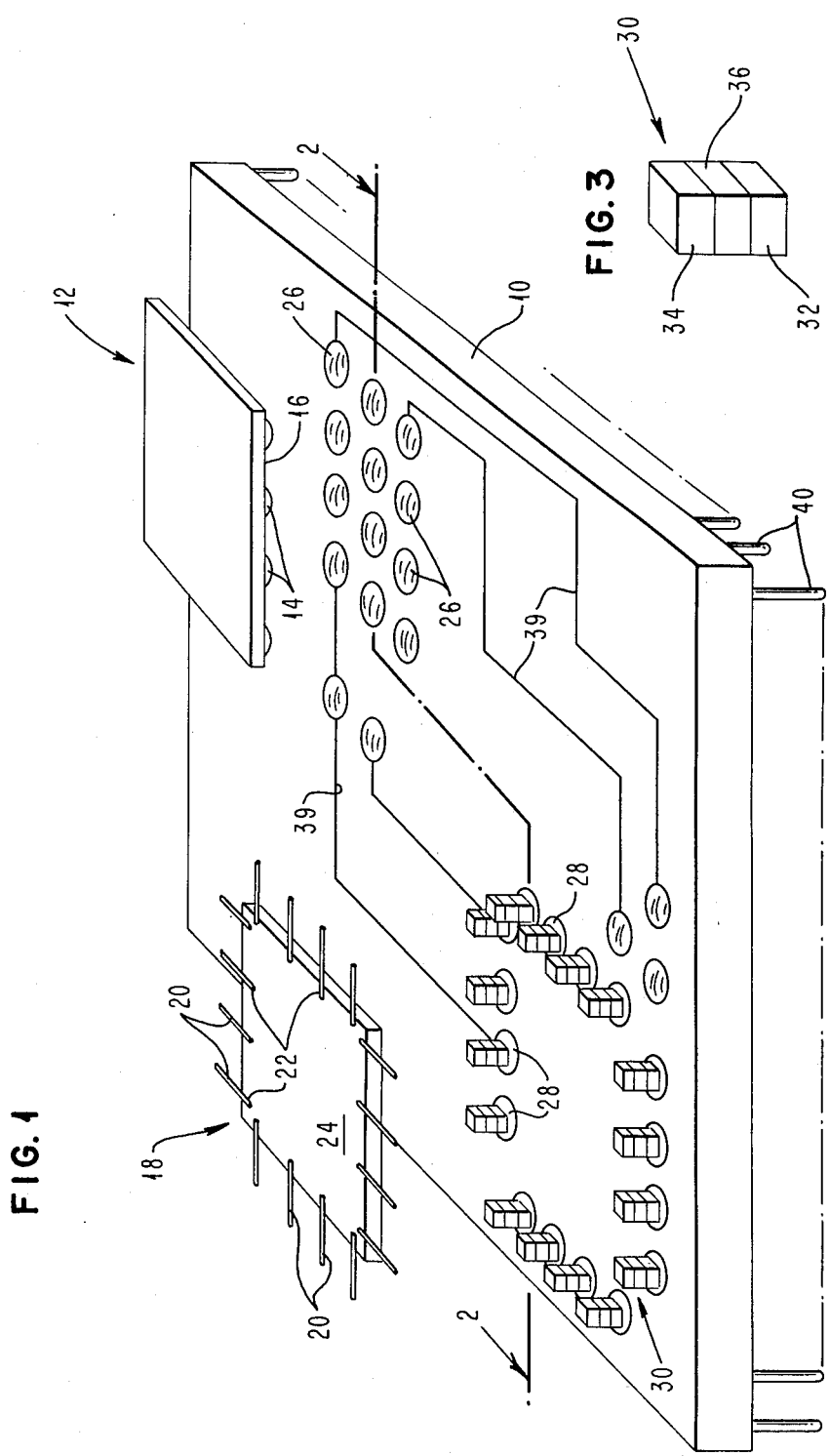
FIG. 1 is an exploded perspective view of a ceramic substrate and two semiconductor chips forming a package according to this invention.
Figure 2:
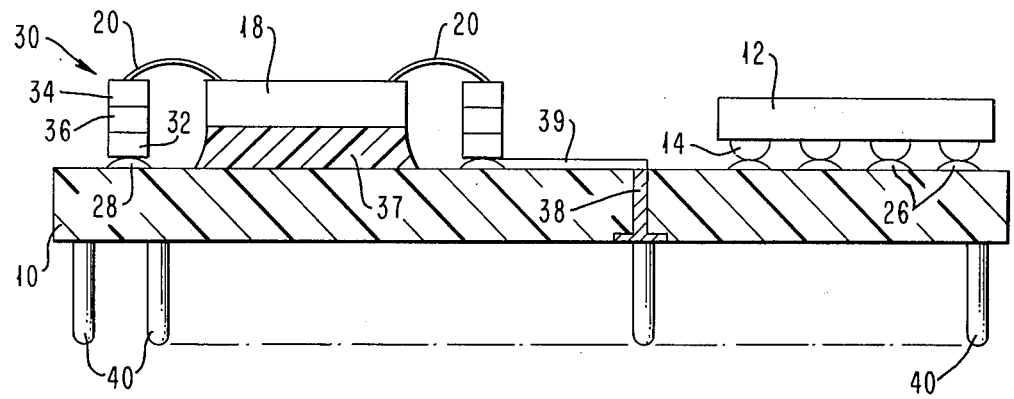
FIG. 2 is a sectional view taken substantially along the plane designated by the line 2—2 of FIG. 1.

Referring now to the drawings, and for the present to FIGS. 1 and 2, a conventional ceramic substrate 10 is provided for the mounting of semiconductor chips according to this invention. The ceramic substrate is configured to mount a flip-chip type chip 12 having conventional Pb/Sn solder balls 14 formed on flip chip face 16 thereof and a wire bond chip 18 having aluminum wires 20 bonded to suitable connections 22 on the face 24 thereof.

The substrate 10 has a first array of Pb/Sn solder pads 26 formed at one location thereon which are arranged to mate with the solder balls 14 on the chip 12. Conventional solder reflow techniques are used to solder the pads 26 to the solder balls 14, and the chip 12 is thus mechanically bonded and electrically connected to the substrate 10.

This substrate also has a second array of solder pads 28 which are configured to correspond with the outer extremeties of wires 20 on the chip 18. Connected to each of the pads in the array of pads 28 is a trimetal pedestal 30, one of which is shown in FIG. 3. Each pedestal 30 has a lower layer of conventional Pb/Sn solder metal 32, an upper layer of aluminum 34, and a central layer of nickel 36 interposed between the solder layer 32 and upper layer 34.

The layer of solder 32 of each pedestal is solder connected to one of the pads in the array 28 such that an array of pedestals 30 is provided having top surface of aluminum 34 arranged to bond with the wires 20 of the chip 18, and thus, weld connection, such as by ultrasonic welding are made between the aluminum top 34 of the pedestal and the aluminum wires 20 of the chip 18. The chip 18 also may be adhesively or metallurgically bonded to the surface of the substrate 10, by epoxy or a soldertype alloy 37, for example, if desired.

Some of the pads of the arrays 26 and 28 are interconnected to each other and to metal filled vias 38 by conductors some of which are shown and designated by the reference character 39. The vias have brazed thereto input/output pins 40. Of course, other type pins, such as swaged pins, could be used, or even non-pin type connections could be used.

It is necessary to utilize the pedestal 30 to connect the solder pads 28 to pads suitable for bonding wire bond type chips that typically use aluminum, or sometimes gold wire since neither aluminum nor gold can be effectively bonded to solder. In the case of aluminum and Pb/Sn solder, no appreciable metallurgical bonding action takes place between the two, and in the case of gold and Pb/Sn, the gold is mutually soluble in the solder so that the gold wire can be completely dissolved after a short period of time, thus destroying the connection. Therefore, a separate pedestal for each pad requiring wire bonding is provided. The bottom metal 32 is solder which will solder bond to the solder pad. The intermediate metal 36 must bond both to the solder metal 32 and the top metal layer 34, and also act as a barrier between them to prevent migration of the solder metal into the gold or aluminum top metal. Nickel or nickel alloys are preferred, but other metals such as copper and copper alloys, and stainless steel, could also be used.

The top layer 34 should be a metal which can be bonded to the wires of the wire bond chip, and these wires are typically aluminum or gold wires. Hence, the top surface metal should be aluminum or gold, depending upon the composition of the wire, to provide optimum mono-metallic bonds.

It is preferred that gold topped pedestals be used to bond to gold wire and aluminum topped pedestals be used to bond to aluminum wire since at the elevated temperatures encountered during processing, or reworking, e.g., about 340° C., gold and aluminum rapidly form undesirable intermetallic compounds.

Figure 4:
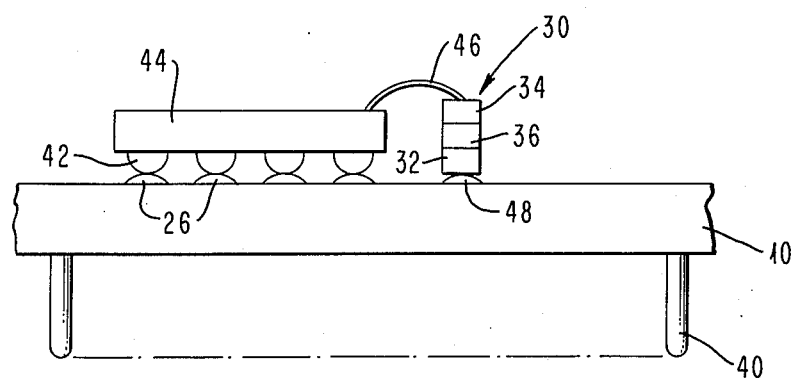
FIG. 4 is a sectional view similar to FIG. 2 wherein a single chip is connected to the substrate with both flip-chip bonding and wire bonding techniques.

Referring now to FIG. 4, another embodiment of this invention is also shown which is adapted to provide both wire bond and flip-chip sholder connections to a single chip. In this case the substrate 10 is provided with an array 26 of solder connections just as previously described which will mate with solder balls 42 on flip-chip semiconductor chip 44. In addition, the chip 44 has an aluminum wire 46 connected to its back side which must be connected to the substrate. This wire can be for any of a number of purposes, such as grounding, etc. For such a connection an additional solder pad 48 is provided to which is soldered a pedestal 30. The aluminum layer 34 of the pedestal is bonded, e.g., by ultrasonic techniques to the wire 46.

By the use of this technique, a substrate can be processed according to conventional techniques to provide solder pad connections, and where these are not appropriate a pedestal 30 can be used to convert the solder pad technology to wire bond technology and both technologies can co-exist on the same substrate. One of the great benefits of this existence of both technologies on the same substrate is that the modules can be processed, and even reworked, by heating to above 340° C. and removing and replacing either a flip-chip or wire bonded chip without adversely affecting the other.

Indeed, it is also possible that this technique can find application where no flip-chip bonding is utilized at all on some substrates, but only wire bonding is employed. Such a technique could be employed as a cost saving technique if a manufacturer wants to invest only in one type of technology for substrates, but on some occasions has a need to bond only wire bond type chips to the substrate rather than flip-chip bonding a combination of flip-chip and wire bonding technologies. The flip-chip technology type substrate, with solder pads, can then be used to mount only wire bonded chips by utilizing pedestals according to this invention.

What is claimed is:

1. A package for semiconductor integrated circuits comprising:
    a substrate having input/output means;
    a plurality of solder pads on said substrate;
    at least one integrated circuit chip having its back surface attached to said substrate in a face-up configuration with contact pad metal adapted to receive wire bond type connections;
    at least one of said solder pads on said substrate having a multi-layer metallic pedestal thereon, said multi-layer metallic pedestal having a solder layer joined to said at least one solder pad, an upper layer of said pedestal made of the same metal as said contact pad metal and adapted to receive wire bond type connections, and a barrier layer of metal interposed between said solder layer and said upper layer, said barrier layer being substantially impervious to both solder and the metal of said upper layer;
    a wire formed from the same metal as the contact pad metal and said upper layer, bonded thereto to form a high temperature sustaining wire bond connection between the contact pad metal on the face-up integrated circuit chip and the multi-layer metallic pedestal on the substrate;
    a predetermined number of said solder pads arranged in a pattern for interconnecting at least one integrated circuit chip to said substrate in a flip-chip configuration;
    at least one integrated circuit chip attached to said substrate in a flip-chip configuration by means of said predetermined number of solder pads which are arranged for interconnecting integrated circuit chips in a flip-chip configuration;
    interconnecting conductor lines on said substrate for providing electrical connections between a preselected number of said solder pads which are connecting an integrated circuit chip to said substrate in a face-up configuration and a preselected number of said solder pads connecting an integrated circuit chip to said substrate in a flip-chip configuration.

2. A package for semiconductor integrated circuits as in claim 1 wherein the high temperature sustaining wire bond connection is a mono-metallic system comprising:
    an aluminum wire bonded to an aluminum contact pad metal on the face-up integrated circuit chip, and also bonded to an aluminum upper layer of said multi-layer metallic pedestal.

3. A package for semiconductor integrated circuits as in claim 1 wherein the high temperature sustaining connection is a mono-metallic system comprising:
    a gold wire bonded to a gold contact pad metal on the face-up integrated circuit chip, and also bonded to a gold upper layer of said multi-layer metallic pedestal.

4. A package for semiconductor integrated circuits as in claim 1 where said barrier layer comprises metal selected from the group consisting of nickel, nickel alloys, copper, copper alloys, and stainless steel.

* * * * *